US009552869B1

(12) United States Patent
Cordero et al.

(10) Patent No.: US 9,552,869 B1
(45) Date of Patent: Jan. 24, 2017

(54) RANDOM ACCESS MEMORY WITH PSEUDO-DIFFERENTIAL SENSING

(71) Applicant: International Business Machines Corporation, Armonk, NY (US)

(72) Inventors: Edgar R. Cordero, Round Rock, TX (US); Kyu-hyoun Kim, Chappaqua, NY (US); Adam J. McPadden, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/005,663

(22) Filed: Jan. 25, 2016

(51) Int. Cl.
G11C 11/24 (2006.01)
G11C 7/00 (2006.01)
G11C 7/02 (2006.01)
G11C 11/4091 (2006.01)

(52) U.S. Cl.
CPC ................... *G11C 11/4091* (2013.01)

(58) Field of Classification Search
USPC .................. 365/149, 205, 207, 208; 257/296
See application file for complete search history.

(56) References Cited

U.S. PATENT DOCUMENTS

| 4,961,166 A | 10/1990 | Sato et al. |
| 5,367,481 A | 11/1994 | Takase et al. |
| 5,430,672 A * | 7/1995 | Kuwabara ........... G11C 11/4074 365/149 |
| 5,495,440 A * | 2/1996 | Asakura .............. G11C 11/4097 365/149 |
| 5,610,868 A * | 3/1997 | Inaba ...................... G11C 7/06 365/205 |
| 5,638,322 A | 6/1997 | Lacey |
| 5,764,562 A | 6/1998 | Hamamoto |
| 6,377,084 B1 | 4/2002 | Forbes |
| 6,385,108 B2 | 5/2002 | Morzano |
| 6,519,174 B2 | 2/2003 | Kirihata et al. |
| 6,538,476 B2 | 3/2003 | Forbes |
| 6,633,503 B2 | 10/2003 | Morzano |

(Continued)

OTHER PUBLICATIONS

Poulton, John, An Embedded DRAM for CMOS ASICs, Proceedings of the 17th Conference on Advanced Research in VLSI, Sep. 15, 1997, pp. 288-302, IEEE Computer Society, Washington, DC.

(Continued)

*Primary Examiner* — Trong Phan
(74) *Attorney, Agent, or Firm* — Patterson + Sheridan, LLP

(57) ABSTRACT

Embodiments herein describe DRAM that includes storage circuitry coupled between complementary bit lines which are in turn coupled to the same sense amplifier. The storage circuitry includes a transistor and a storage capacitor coupled in series. The gate of the transistor is coupled to a word line which selectively couples the storage capacitor to one of the complementary bit lines. Because the capacitor is coupled to both of the bit lines, when reading the data stored on the capacitor, the charge on the capacitor causes current to flow from one of the bit lines into the other bit line which causes a voltage difference between the complementary bit lines. Put differently, both ends of the capacitor are electrically coupled to bit lines thereby generating a larger voltage difference between the bit lines when reading data from the storage capacitors.

20 Claims, 11 Drawing Sheets

(56) References Cited

U.S. PATENT DOCUMENTS

| | | | |
|---|---|---|---|
| 6,678,198 B2 | 1/2004 | Issa et al. | |
| 6,829,180 B2 | 12/2004 | Shau | |
| 6,853,591 B2 | 2/2005 | Schreck | |
| 6,977,860 B1 | 12/2005 | Tooher et al. | |
| 7,113,437 B2 | 9/2006 | Schweickert et al. | |
| 7,235,835 B2 * | 6/2007 | Nagano | H01L 21/82385 |
| | | | 257/296 |
| 7,352,619 B2 | 4/2008 | Ho | |
| 7,368,950 B2 | 5/2008 | Wu et al. | |
| 7,460,387 B2 | 12/2008 | Matick et al. | |
| 7,613,057 B2 | 11/2009 | Lee | |
| 7,816,717 B2 * | 10/2010 | Ozaki | H01L 27/11502 |
| | | | 257/296 |
| 7,821,858 B2 | 10/2010 | Matick et al. | |
| RE42,659 E | 8/2011 | Takahashi et al. | |
| 8,009,459 B2 | 8/2011 | Wu et al. | |
| 2004/0151020 A1 | 8/2004 | Beer | |
| 2005/0045918 A1 | 3/2005 | Reith | |
| 2005/0169090 A1 | 8/2005 | Shau | |
| 2012/0036315 A1 | 2/2012 | Reohr et al. | |

OTHER PUBLICATIONS

Nalam, Satyanand et al., Asymmetric 6T SRAM with Two-phase Write and Split Bitline Differential Sensing for Low Voltage Operation, Quality Electronic Design (ISQED), Mar. 2010, 8 pages, IEEE, Piscataway, United States.

U.S. Appl. No. 14/797,993, entitled Dynamic Random Access Memory With Pseudo Differential Sensing, filed Jul. 13, 2015.

IBM "List of IBM Patents or Patent Applications Treated as Related".

* cited by examiner

US 9,552,869 B1

RANDOM ACCESS MEMORY WITH PSEUDO-DIFFERENTIAL SENSING

BACKGROUND

Embodiments presented herein generally relate to integrated circuit (IC) memory devices, and more specifically, to dynamic random access memory (DRAM) with differential sensing.

DRAM is a type of random access memory which utilizes separate capacitors to store each bit of data based upon the voltage stored in the capacitors. A memory circuit is formed from an array of DRAM cells where all of the cells in a given column of the array are coupled to a single bit line. Similarly, a single word line may serve all the cells in a given row. In this manner, data stored in one of the DRAM cells in the memory circuit can be read from the cell's capacitor through its respective bit line in response to the word line activating the cell.

DRAM cells and circuits may be produced using semiconductor lithography. Modern trends in DRAM production scale DRAMs to ever smaller lithography sizes. As sizes are reduced, it becomes more difficult to maintain reliability and performance as lithography error rates increase.

SUMMARY

One embodiment of the present invention is a dynamic random access memory (DRAM) that includes a first bit line and a second bit line, wherein the first and second bit lines form a complementary pair of bit lines coupled with a sense amplifier. The DRAM includes a storage capacitor having a first node coupled with the first bit line and a transistor comprising a gate coupled with a word line. The transistor includes a second node coupled with a third node of the storage capacitor and a fourth node coupled with the second bit line and the sense amplifier is configured to evaluate a voltage difference between the first and second bit lines to determine a data bit stored in the storage capacitor.

Another embodiment of the present invention is an integrated circuit that includes a first bit line and a second bit line, where the first and second bit line form a complementary pair of bit lines coupled with a sense amplifier. The integrated circuit also includes a storage capacitor and a transistor includes a gate coupled to with a word line. The transistor and the storage capacitor are coupled in series between the first and second bit lines and the sense amplifier is configured to evaluate a voltage difference between the first and second bit lines to determine a data bit stored in the storage capacitor.

Another embodiment of the present invention is a method that includes activating a transistor that includes a first node coupled with a storage capacitor in a DRAM, a second node of the transistor is coupled with a first bit line, and a third node of the storage capacitor is coupled with a second bit line. The first and second bit lines form a complementary pair of bit lines coupled with a sense amplifier. The method also includes evaluating, while the transistor is active, a voltage difference between the first and second bit lines using the sense amplifier to determine a data bit stored in the storage capacitor.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe DRAM that includes storage circuitry coupled between complementary bit lines which are in turn coupled to the same sense amplifier. The storage circuitry includes a transistor and a storage capacitor coupled in series. The gate of the transistor is coupled to a word line which selectively couples the storage capacitor to one of the complementary bit lines. When reading data stored in the capacitor, the complementary bit lines are charged to an intermediate voltage (e.g., VDD/2) which is affected by the charge stored on the capacitor. Because the capacitor is coupled to both of the bit lines, the charge on the capacitor (or lack thereof) causes current to flow from one of the bit lines into the other bit line which results in a voltage difference between the complementary bit lines. Put differently, instead of coupling one end of the storage capacitor to a fixed voltage, both ends of the capacitor are coupled to bit lines thereby generating a larger voltage difference between the bit lines when reading data from the storage capacitors.

Figure 1:
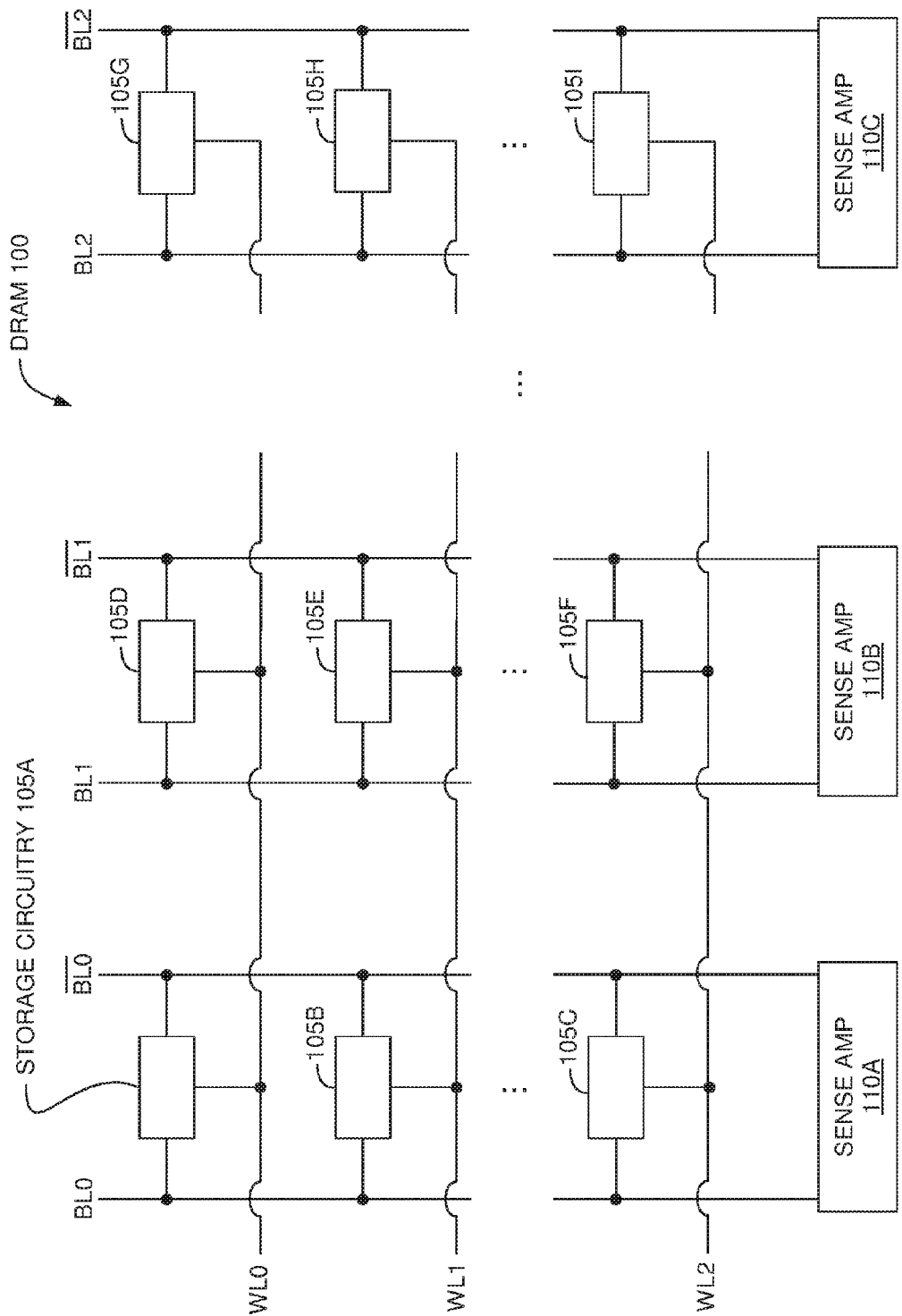
FIG. 1 illustrates a DRAM with storage circuitry disposed between complementary bit lines, according to one embodiment described herein.

FIG. 1 illustrates a DRAM 100 with storage circuitry 105 disposed between complementary bit lines, according to one embodiment described herein. As shown, the DRAM 100 includes multiple columns that each includes a complementary pair of bit lines (e.g., BL0, /BL0, BL1, /BL1, etc. where "/" corresponds to the bar symbol shown in the figures above complementary bit lines) which are each coupled to the same sense amplifier 110. That is, bit lines BL0 and /BL0 are coupled to sense amplifier 110A, bit lines BL1 and /BL1 are coupled to sense amplifier 110B, and so forth. The DRAM 100 also includes word lines (e.g., WL0, WL1, etc.) which define multiple rows in the DRAM 100. In one embodiment, the DRAM 100 uses the word lines to address storage circuitry 105 in order to store or read data from the memory module.

As shown, the storage circuitry 105 (e.g., 105A, 105B, 105C, 105D, 105E, 105F, 105G, 105H, 105I, etc.) is coupled between the complementary bit lines in each of the columns to form individual DRAM cells. As shown, storage circuitry 105A, 105B, and 105C are coupled between BL0 and /BL0. The word lines determine which one of the storage circuitry 105 in a given column is active when data is being stored in, or read out from, the DRAM 100. For example, if WL0 is active, then storage circuitry 105A, 105D, and 105G are active. If reading data from the storage circuitry 105, the active storage circuitry 105 is coupled to a respective sense amplifier 110 which determines whether the circuitry 105 stores a logical one or zero. Assuming WL0 is active, sensing amplifiers 110A-C read the data stored in the circuitry 105A, 105D, and 105G.

In one embodiment, the storage circuitry 105 includes a capacitor that stores charge indicating a logical one or zero. When reading from the capacitor, its charge affects the voltage on the complementary bit lines which indicates to the sense amplifier 110 whether a logical one or zero was previously stored in the circuitry 105. Unlike other DRAMs where one side of the capacitor is coupled to a reference voltage, here each side of the capacitor in the storage circuitry 105 is coupled to a respective one of the complementary bit lines in a column. As described in more detail below, doing so may improve the DRAM array timings, refresh rates, and system performance.

Moreover, the arrangement of the DRAM 100 permits the bit lines to be coupled to the sense amplifiers 110 without any selection logic. Put differently, each sense amplifier 110 is coupled to only one pair of complementary bit lines rather than being selectively coupled to more than two bit lines in the DRAM 100. As such, in one embodiment, the DRAM 100 does not include transistors or other switches between the outputs of the bit lines and the sense amplifiers 110.

Figure 2:
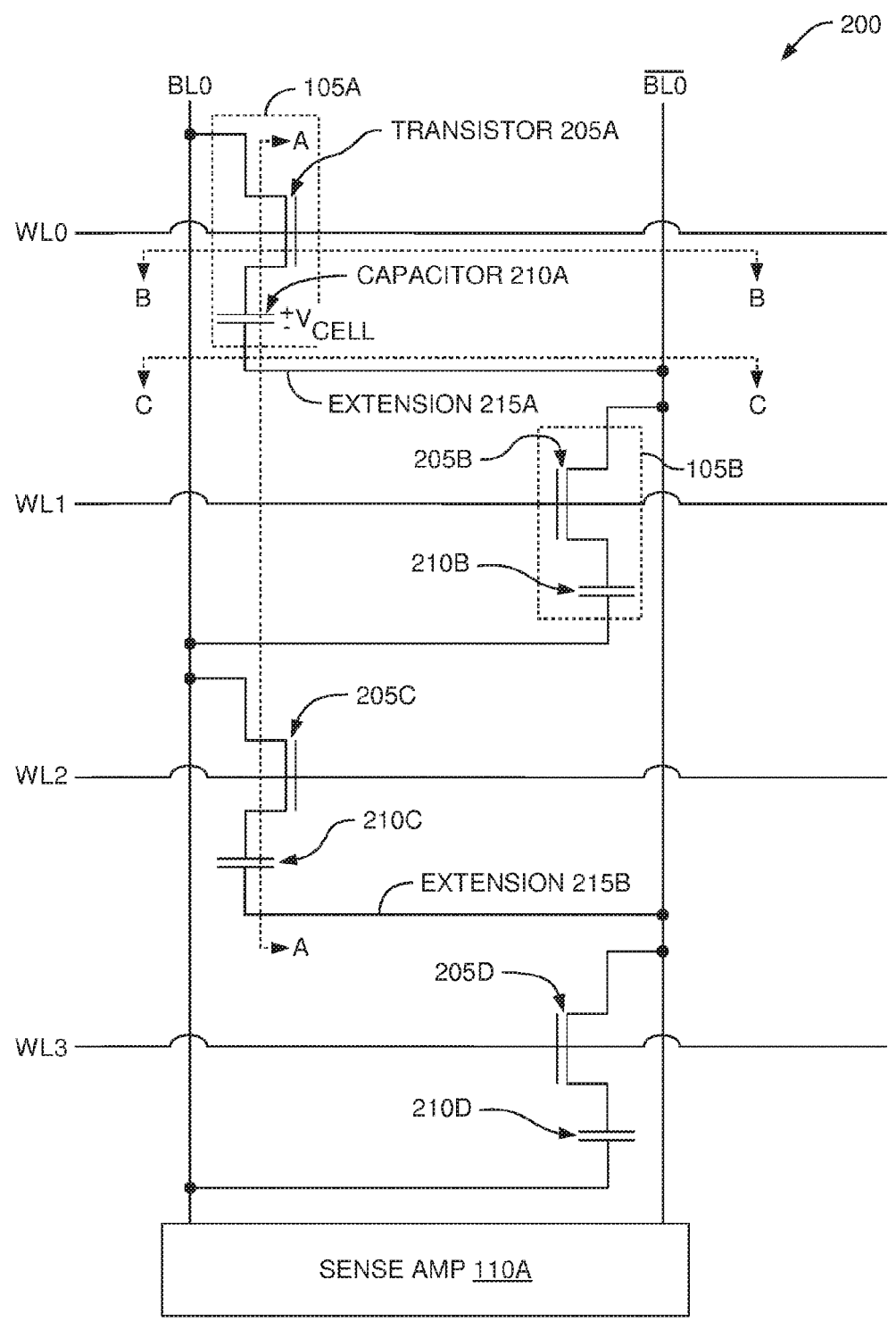
FIG. 2 illustrates a DRAM column with storage circuitry disposed between complementary bit lines, according to one embodiment described herein.

FIG. 2 illustrates a DRAM column 200 of DRAM 100 shown in FIG. 1, according to one embodiment described herein. In this embodiment, the storage circuitry 105 includes a transistor 205 (e.g., 205A, 205B, 205C, 205D, etc.) and capacitor 210 (e.g., 210A, 210B, 210C, 210D, etc.). As shown, gates of the transistors 205 are coupled to respective word lines while a first node of the transistors 205 is coupled to one of the capacitors 210 and a second node is coupled to one of the bit lines.

In the top row, storage circuitry 105A includes transistor 205A and capacitor 210A, while in the second row, storage circuitry 105B includes transistor 205B and capacitor 210B. In this embodiment, the order in which the bit lines are coupled to the circuit elements in the storage circuitry 105 is reversed for each subsequent row. That is, in row one, BL0 is directly coupled to the transistor 205A while /BL0 is directly coupled to the capacitor 210A. In row two, however, BL0 is directly coupled to the capacitor 210B, while /BL0 is directly coupled to the transistor 205B. Advantageously, assuming an even number of rows, the complementary bits line BL0 and /BL0 have symmetric loading and the total capacitance load for both BL0 and /BL0 are the same. Symmetric loading may result in the DRAM being more tolerant to noise than arrangements where the loading is not symmetric between the complementary bit lines. Moreover, although FIG. 2 illustrates direct connection between the transistors 205 and the capacitors 210 to the bit lines BL0 and /BL0, in other embodiments, there may be circuitry disposed between these elements such they are not directly connected and still permit the DRAM to function as described below.

Figure 4:
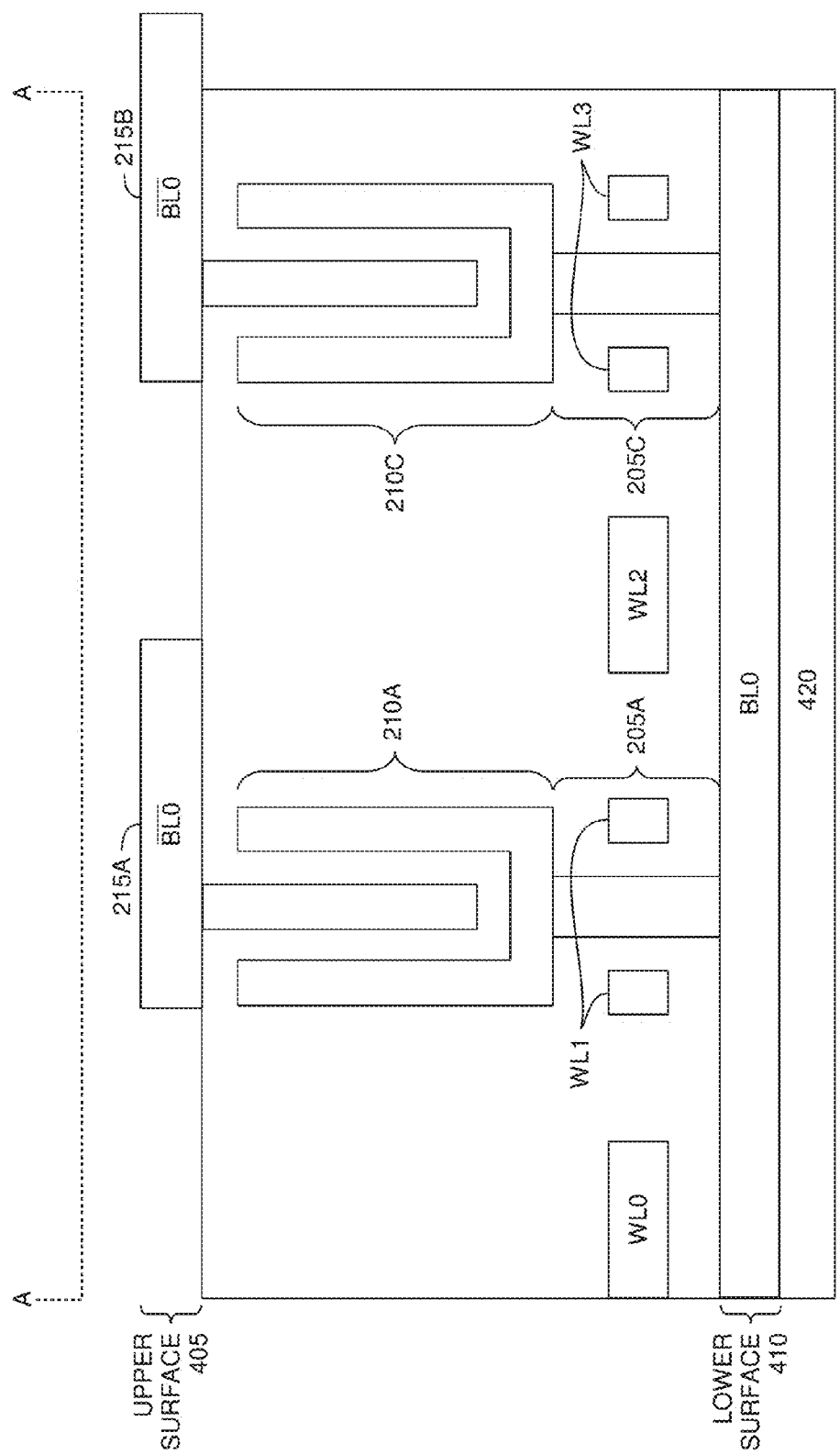
FIGS. 4-6 are cross sections of the DRAM column in FIG. 2, according to one embodiment described herein.
Figure 5:
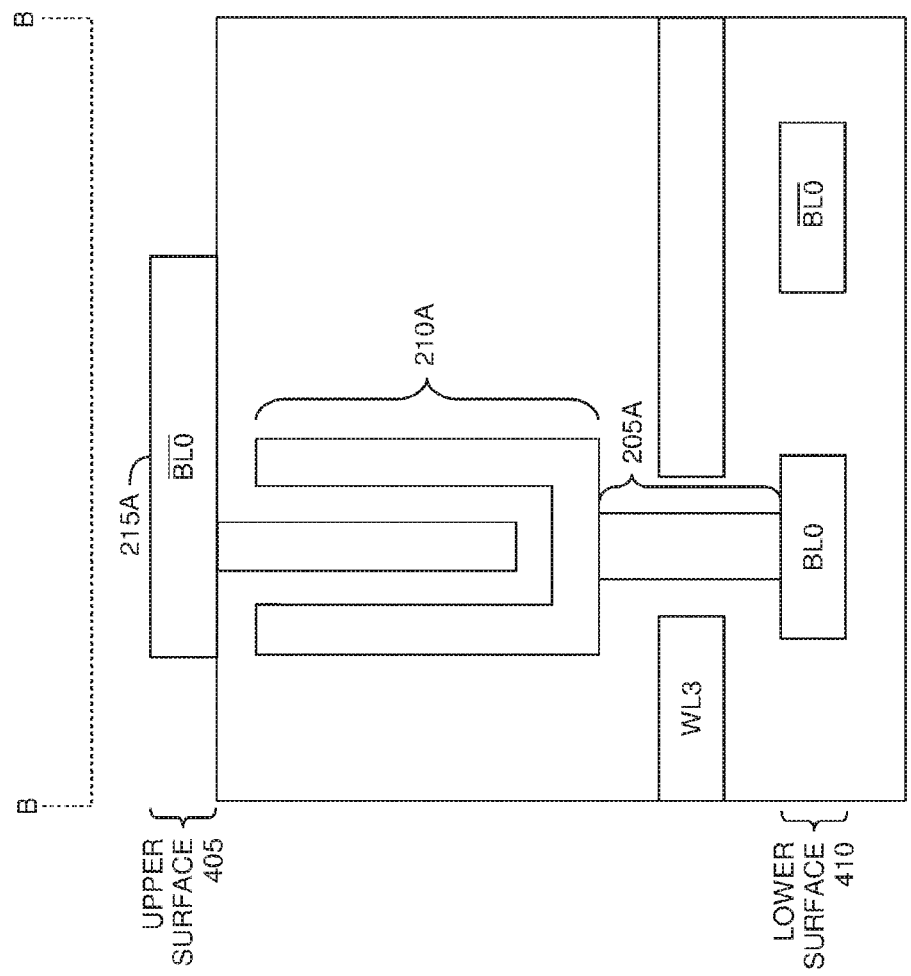
Figure 6:
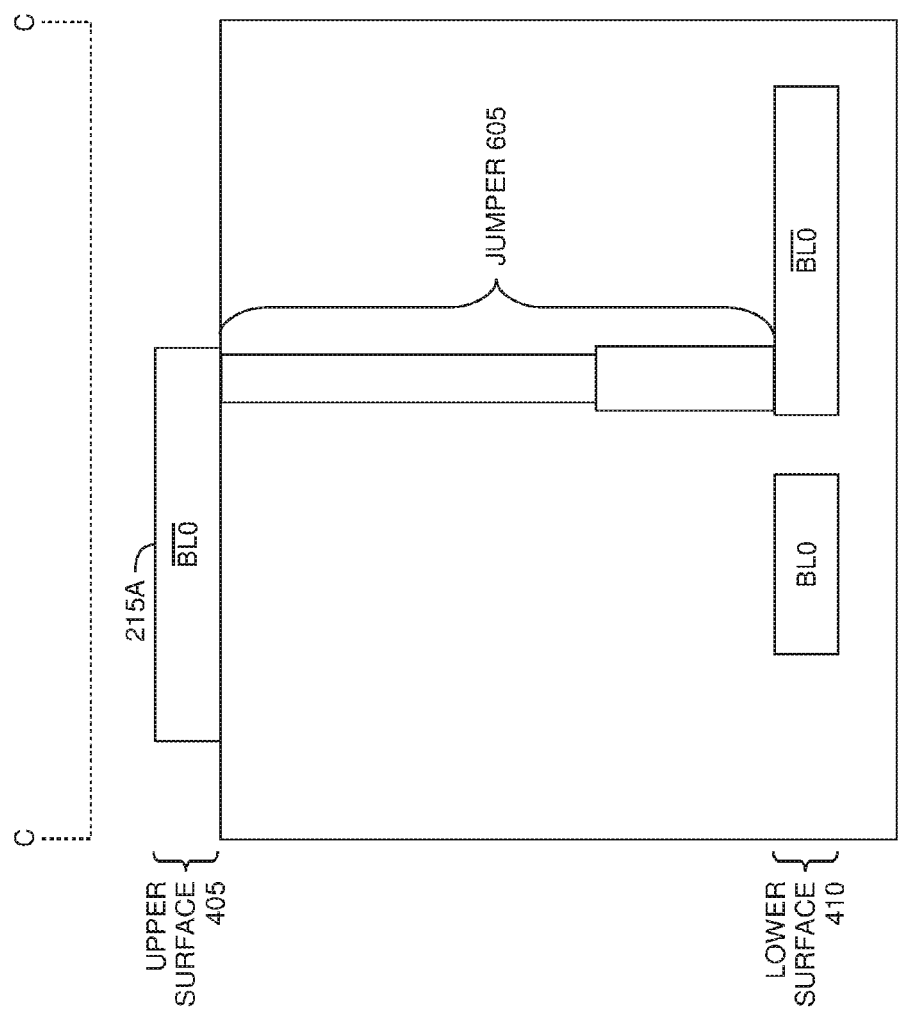

Although the 3D structure of the column 200 is described in more detail in the figures below, in one embodiment, the bit lines BL0 and /BL0 are disposed on the same plane. However, in order to improve performance, the transistors 205 and capacitors 210 may be formed using vertical structures which extend in a direction perpendicular to the plane containing the bit lines BL0 and /BL0. As such, the column 200 includes extensions 215 (shown as 215A and 215B) which electrically couple bit line /BL0 to a top of the vertical structure while the bottom of the vertical structure couples bit line BL0. The details of this vertical structure and extension 215 are shown in FIGS. 4-6 below.

The charge stored across the capacitors 210 indicates whether the capacitors 210 store a logical one or zero. To determine this charge, the sense amplifier 110A compares the voltage of bit line BL0 to /BL0.

The DRAM arrangement shown in FIGS. 1 and 2 allows for an increased charge in the capacitors for a particular lithography size by allowing the storage capacitor to be charged using a larger potential voltage difference. Put differently, by connecting the capacitors 210 to both bit lines, the voltage $V_{CELL}$ is larger than when only one side of the capacitors 210 is coupled to a bit line. When a write is performed to a DRAM cell, a transistor 205 connects the selected capacitor 210 to the bit lines /BL0 and BL0. If storing a logical one in the capacitor 210, the bit lines /BL0 and BL0 are driven to different voltages which stores charge on the capacitor 210. For example, BL0 is driven to VDD while /BL0 is driven to ground (GND). As such, the value of $V_{CELL}$ is VDD rather than, e.g., VDD/2.

Figure 3:
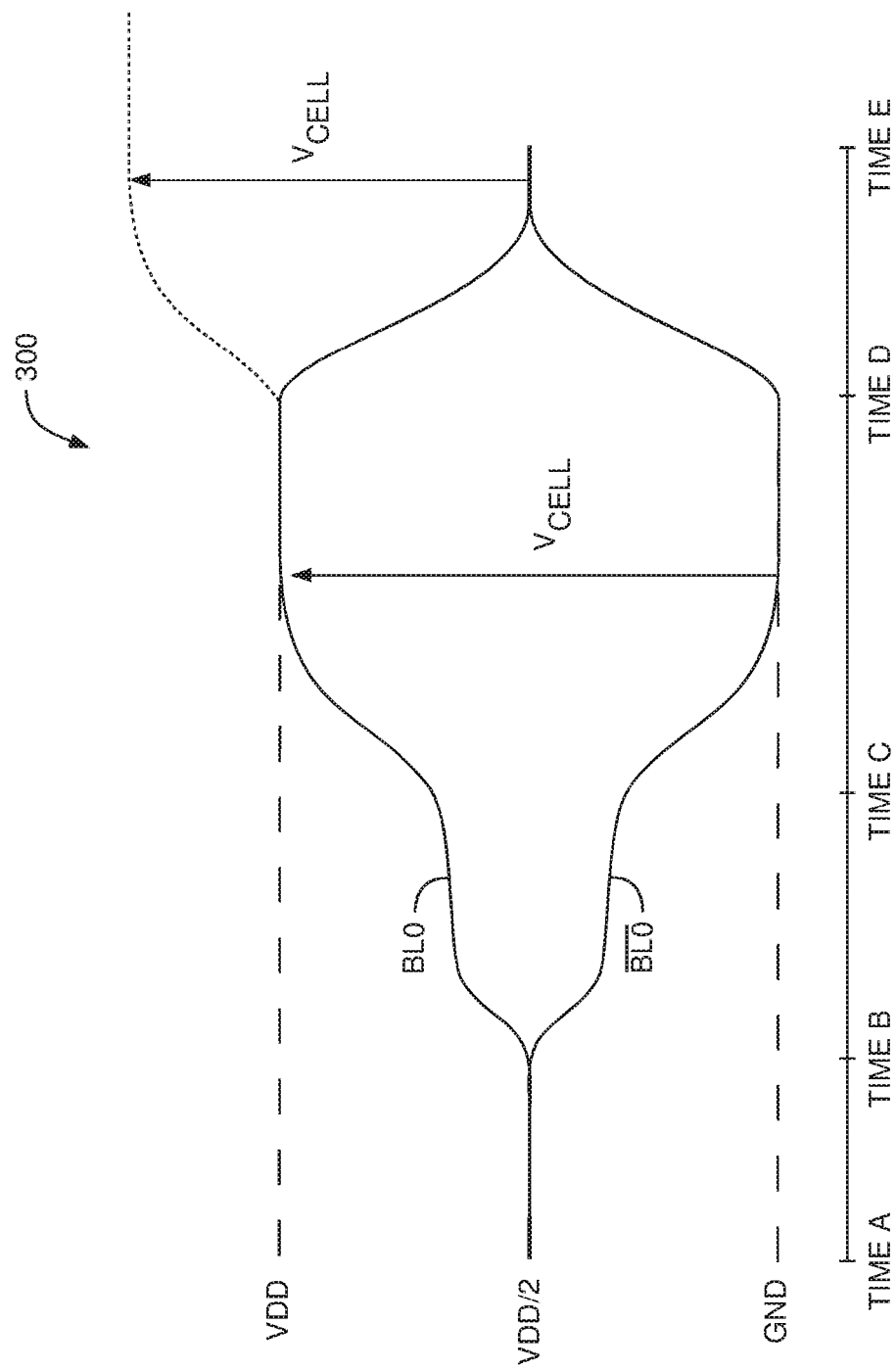
FIG. 3 is a timing chart for reading a bit line in DRAM, according to one embodiment described herein.

FIG. 3 is a timing chart 300 for reading a bit from the column 200 in FIG. 2 using pseudo differential sensing, according to one embodiment described herein. At Time A, the bit lines are driven to VDD/2 while the transistor prevents the charge on the capacitor from affecting the complementary bit lines. At Time B, the transistor is activated, thereby permitting the charge stored in the capacitor to affect the voltage on the bit lines. As shown, the charge across the selected capacitor cause the voltage on both bit line BL0 and bit line /BL0 to change. Specifically, the voltage on BL0 increases while the voltage on /BL0 decreases. Put differently, the charge on the selected capacitor causes a current to flow between the bit lines. Thus, whatever charge flows out of one of the bit lines flows into the other. In contrast, if the selected capacitor was not connected to both bit lines, then the voltage on only one of the bit lines (i.e., the bit line coupled to the selected capacitor) would change while the other bit line would remain at VDD/2. Thus, the arrangement shown in FIGS. 1 and 2 provides the advantage of increasing the voltage difference between the bit lines BL0 and /BL0 relative to coupling the capacitor to only one of the bit lines.

At Time C, the sense amplifier evaluates the voltage difference between bit lines BL0 and /BL0 to determine which direction to pull the voltages on these lines. Because the voltage across the selected capacitor (i.e., $V_{CELL}$) is VDD rather than VDD/2, this means more charge is stored in the capacitor which results in a greater change in voltage between the bit lines at Time C. In this example, the sense amplifier determines the voltage on BL0 is more positive than /BL0, and in response, pulls BL0 to VDD and /BL0 to ground. In contrast, if the selected capacitor stored a logical zero (i.e., there is no or very little charge on the capacitor), then /BL0 would be more positive than BL0 and at Time C the sense amplifier would pull /BL0 to VDD and BL0 to ground.

At Time D, the sense amplifier performs a pre-charge phase where the bit lines are again driven to VDD/2 (or be shorted together at the sense amp) after the transistor is deactivated. Assuming capacitor 210A is the selected capacitor, during Time D, the transistor 205A is turned off, and as a result, the node between the transistor 205A and the upper side of the capacitor 210A is floating. The lower side of the capacitor 210A remains coupled to bit line /BL0. As such, the voltage $V_{CELL}$ across the capacitor 210A remains at VDD as shown by the dotted line. That is, as the voltage on /BL0 increases, the voltage at the node between capacitor 210A and transistor 205A increases to maintain VDD across the capacitor during the pre-charge phase between Time D and Time E.

FIG. 4 is a cross section of the DRAM column in FIG. 2, according to one embodiment described herein. Specifically, FIG. 4 illustrates a view of the cross section A-A in FIG. 2. As shown, the capacitors 210A and 210C form vertical structures with the transistors 205A and 205C. Bit line BL0 extends from left to right along a lower surface 410 while the extensions 215A and 215B of bit line /BL0 are disposed on an upper surface 405. Although not shown here, the bit line /BL0 is disposed on the lower surface 410 in a planar relationship with bit line BL0. As shown, the lower surface 410 is disposed on a substrate 420. In order to form the vertical structure, the bit line /BL0 on the lower surface is electrically coupled to the extensions 215A and 215B on the upper surface 405. Moreover, although FIG. 4 illustrates that the extensions 215A and 215B are not electrically connected along the upper surface 405 (which reduces capacitance in the DRAM), in other embodiments the extensions 215 may be formed using a unitary layer of conductive material.

In this embodiment, the word lines form a vertical surrounded gate for the transistors 205A and 205C. As mentioned above, the word lines WL1 and WL3 activate the transistors 205A and 205C thereby permitting charge to either be stored on, or read from, the capacitors 210A and 210C. The transistors formed using WL0 and WL2 are not shown in FIG. 4 since these vertical structures may be offset in the IC relative to the vertical structures shown.

FIG. 5 is a cross section of the DRAM column in FIG. 2, according to one embodiment described herein. Specifically, FIG. 5 illustrates a view of the cross section B-B in FIG. 2. In this view, the word line WL3 extends across the page while cross sections of bit line BL0 and /BL0 are shown in the lower surface 410. Both of the bit lines BL0 and /BL0 extend in a direction into and out of the page. In this embodiment, the bit lines BL0 and /BL0 extend along the DRAM column 200 shown in FIG. 2 along the same plane—i.e., lower surface 410.

FIG. 5 also illustrates a portion of the extension 215A for bit line /BL0 in the upper surface 405. As discussed above, the extension 215A is electrically coupled to the main portion of bit line /BL0 in the lower surface 410. As such, the voltage on extension 215A is substantially the same as the voltage on the main portion of bit line /BL0 in the lower surface 410.

FIG. 6 is a cross section of the DRAM column in FIG. 2, according to one embodiment described herein. Specifically, FIG. 6 illustrates a view of the cross section C-C in FIG. 2. This view includes a jumper 605 electrically coupling the main portion of the bit line /BL0 in the lower surface 410 to the extension 215A of bit line /BL0 in the upper surface 405. The jumper 605 can be any conductive structure that electrically couples the portions of bit line /BL0 in the upper surface 405 to the lower surface 410. In one embodiment, the jumper 605 may include the same materials used to form the transistors and capacitors shown in FIG. 4. As such, the jumper 605 can be fabricated in parallel with these components when forming the DRAM. By using the jumper 605, the bit lines BL0 and /BL0 can be disposed in the same plane but still enable the DRAM to include the vertical structure shown in FIG. 4.

Figure 7:
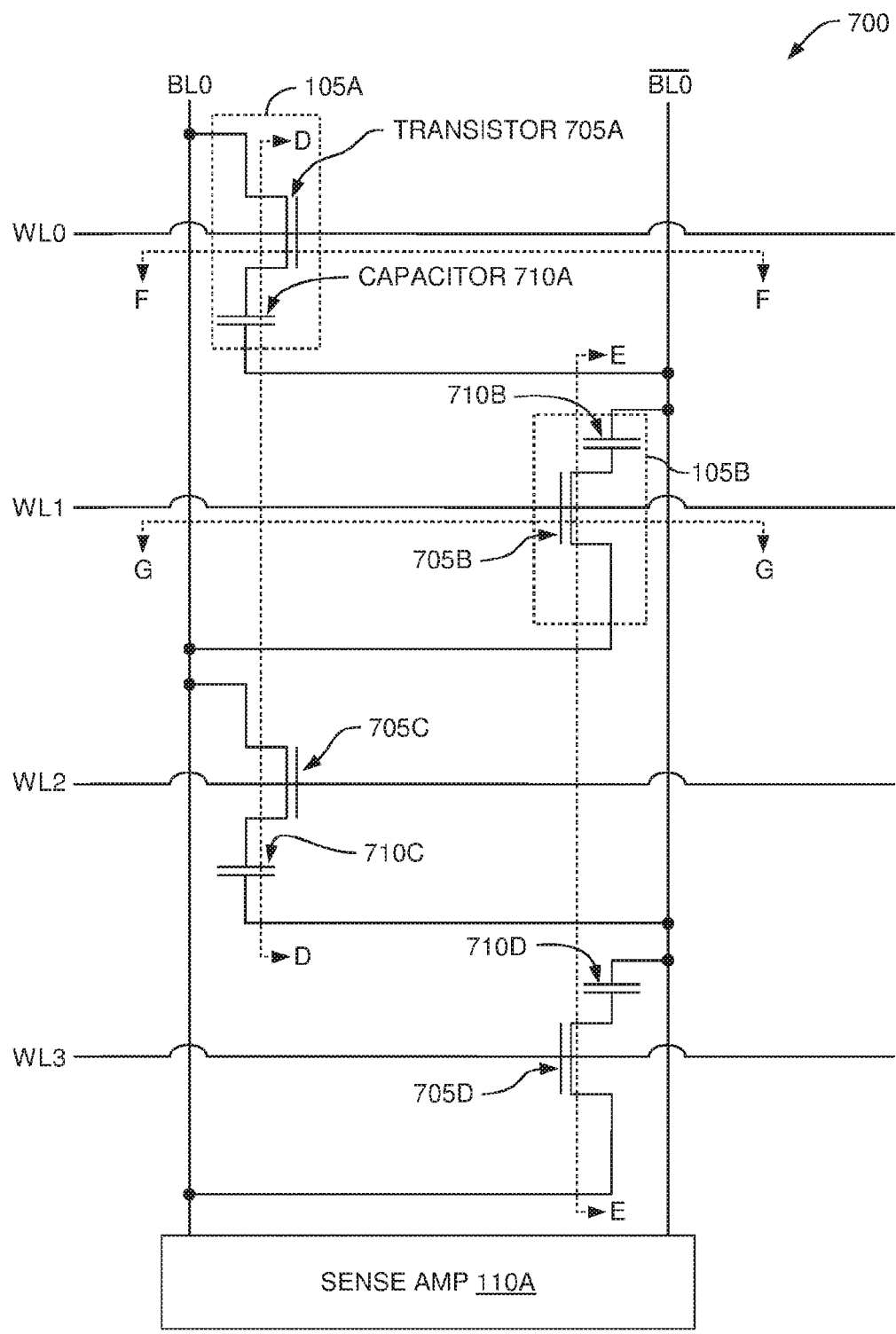
FIG. 7 is a DRAM column with storage circuitry disposed between complementary bit lines, according to one embodiment described herein.

FIG. 7 is a DRAM column 700 with storage circuitry disposed between complementary bit lines, according to one embodiment described herein. The DRAM column 700 is similar to the DRAM column 200 shown in FIG. 2 except that the bit line BL0 is coupled to the transistors 705 while bit line /BL0 is coupled to the capacitors 710. In contrast, in DRAM column 200, the bit lines BL0 and /BL0 alternate which are coupled to the transistors 205 and which are coupled to the capacitors 210. That is, in the top row, BL0 is coupled to transistor 205A while /BL0 is coupled to capacitor 210A. However, in the second to the top row, BL0 is coupled to capacitor 210B while /BL0 is coupled to transistor 205B. In DRAM column 700, however, BL0 is coupled to the transistors 705 in all the rows while /BL0 is coupled to the capacitors in all the rows. However, despite having different arrangements, the functionality of the DRAM in FIGS. 2 and 7 is the same.

The loading for the bit lines in DRAM column 700 is not symmetric. That is, bit line BL0 is directly coupled to the drains of the four transistors 705 while bit line /BL0 is directly coupled to the four capacitors 710. However, this asymmetric loading does not have a significant effect on the performance of the DRAM in FIG. 7. Because the electrical nodes between the transistors 705 and the capacitors 710 are floating when the transistors 705 are inactive, both of the bit lines BL0 and /BL0 are loaded with the series resistance of the transistors 705 and the capacitors 710. Put differently, instead of being loaded by the individual components (i.e., either the transistor or the capacitor) the bit lines BL0 and /BL0 are loaded with the combination of the transistors 705 and capacitors 710. Thus, regardless whether the bit lines are coupled to the transistors 705 or the capacitors 710, the resulting loading and the parasitic capacitance is substantially the same when viewed from either bit line. Moreover, although the arrangement in FIG. 7 does not have symmetric loading on the bit lines, this arrangement does enable the bit lines to be disposed on different planes which may increase the density of the memory elements in the DRAM relative to the arrangement shown in FIG. 2.

Figure 8:
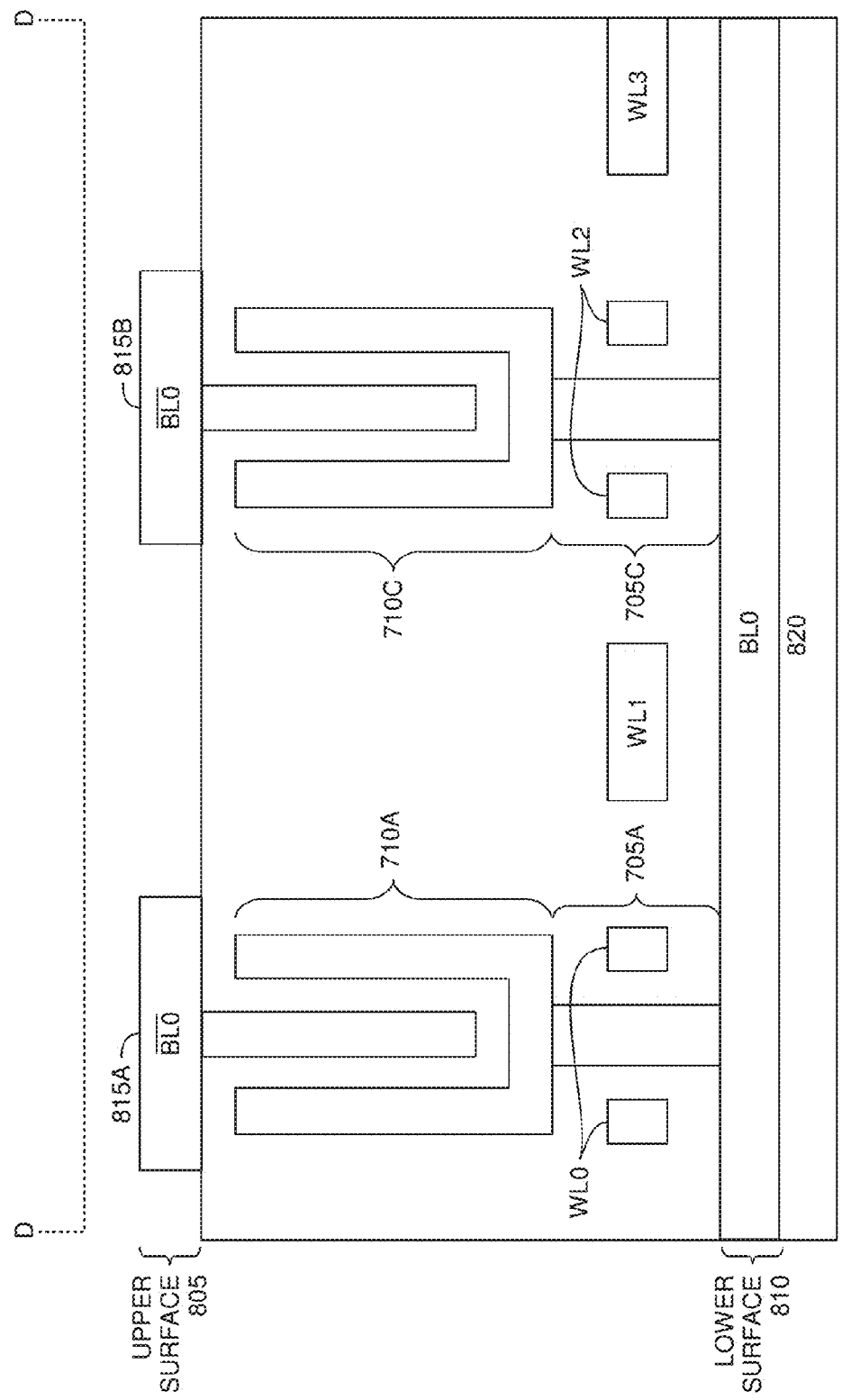
FIGS. 8-11 are cross sections of the DRAM column in FIG. 7, according to one embodiment described herein.

FIG. 8 is a cross section of the DRAM column in FIG. 7, according to one embodiment described herein. Specifically, FIG. 8 illustrates a view of the cross section D-D in FIG. 7. As shown, the transistors 705A and 705C and capacitors 710A and 710C form vertical structures between bit line /BL0 disposed on an upper surface 805 and bit line BL0 disposed on a lower surface 810. As shown the lower surface 810 is disposed on a substrate 820. However, unlike in FIGS. 4-6 where portions of the bit line /BL0 are disposed in both upper and lower surfaces, here, all of bit line /BL0 may be disposed in the upper surface 805 while all of bit line BL0 is disposed in the lower surface 810, As such, the DRAM does not need jumpers coupling different portions of the bit line to different layers in the IC.

In this embodiment, only a portion of bit line /BL0 is disposed directly above bit line /BL0. That is, the main portions of bit line /BL0 and BL0 are offset so that they are not directly disposed over each other. Instead, to form the vertical structures above bit line BL0, the bit line /BL0 includes protrusions 815A and 815B which extend away from the main portion of bit line /BL0 and cover a portion of bit line BL0.

Figure 9:
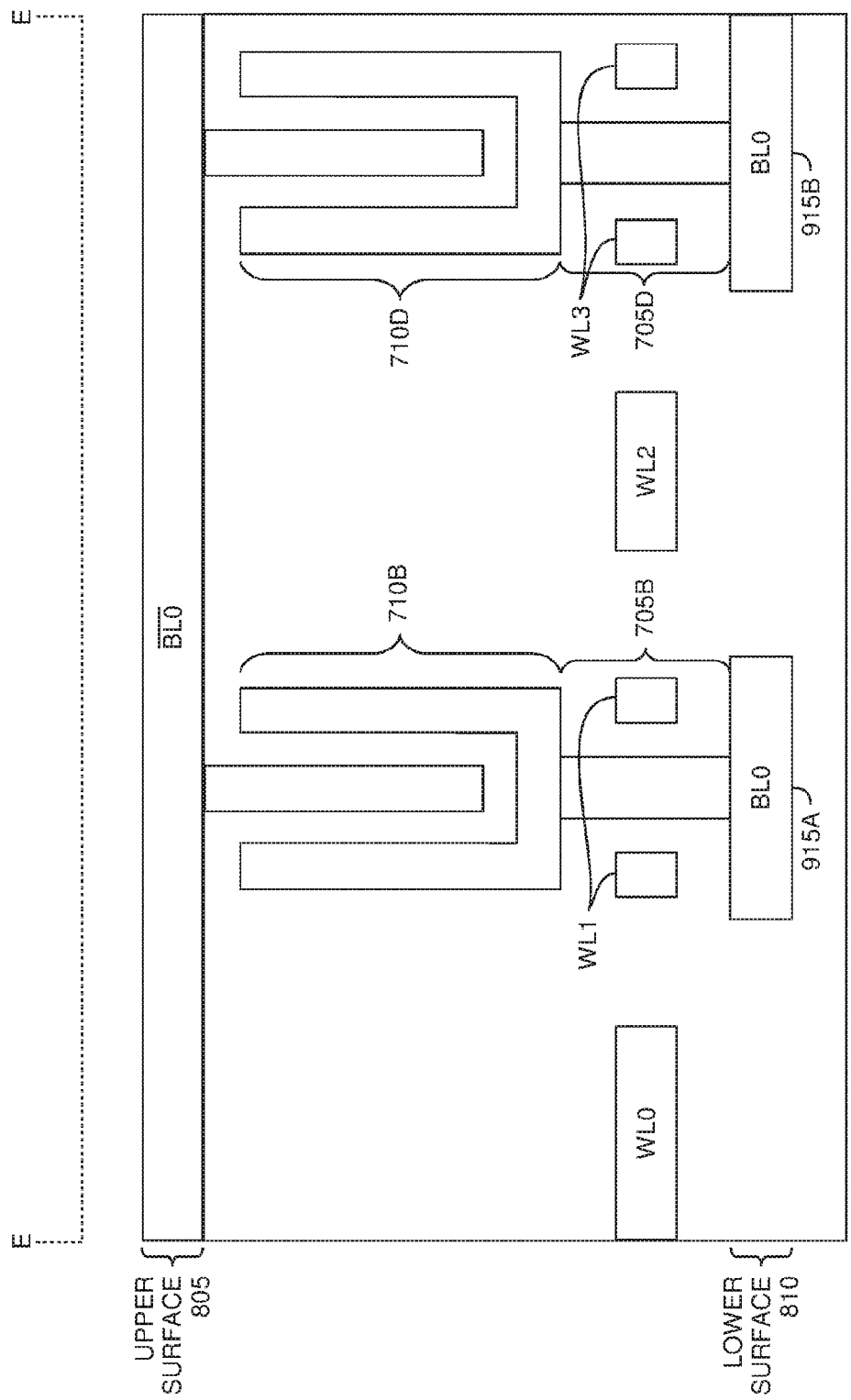

FIG. 9 is a cross section of the DRAM column in FIG. 7, according to one embodiment described herein. Specifically, FIG. 9 illustrates a view of the cross section E-E in FIG. 7. As shown, the transistors 705B and 705D and capacitors 710B and 710D form vertical structures between bit line /BL0 disposed on an upper surface 805 and bit line BL0 disposed on a lower surface 810. This view illustrates protrusions 915A and 915B which extend from the main portion of bit line BL0 as shown in FIG. 8. The main portion of bit line /BL0 is disposed over the protrusions 915A and 915B of bit line BL0.

In this embodiment, the vertical structures that include the transistors 705 and capacitors 710 are offset. Specifically, the vertical structures containing transistors 705A and 705C and capacitors 710A and 710C are disposed over the main portion of bit line BL0 while the vertical structures containing transistors 705B and 705D and capacitors 710B and 710D are disposed under the main portion of bit line /BL0. However, in other embodiments, the bit lines BL0 and /BL0 may be disposed directly over each other which means the vertical structures formed from transistors 705A-D and capacitors 710A-D can be disposed along the same plane rather than two offsetting planes as shown in FIGS. 8 and 9.

Figure 10:
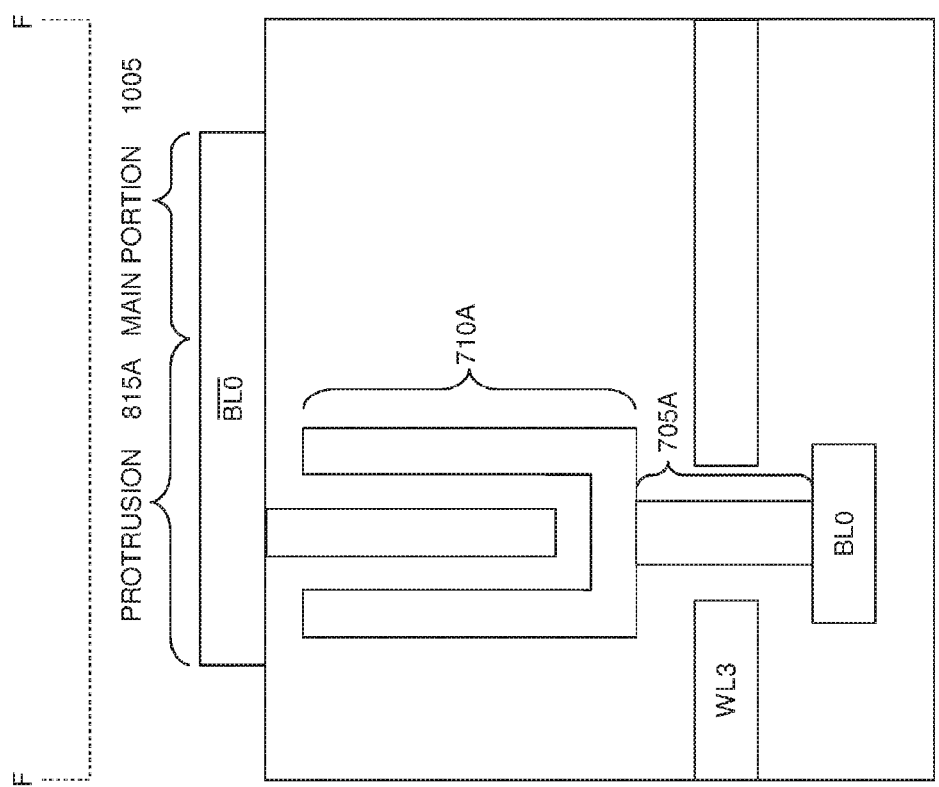

FIG. 10 is a cross section of the DRAM column in FIG. 7, according to one embodiment described herein. Specifically, FIG. 10 illustrates a view of the cross section F-F in FIG. 7. The bit line /BL0 in FIG. 10 is divided into the protrusion 815A and a main portion 1005. As shown, the protrusion 815A extends away from the main portion 1005 perpendicular to the direction in which the main portion 1005 extends in the DRAM column 700 (i.e., into and out of the page). Using the protrusion 815A permits the DRAM to offset the vertical structures as shown in FIGS. 8 and 9 which may increase memory density.

Figure 11:
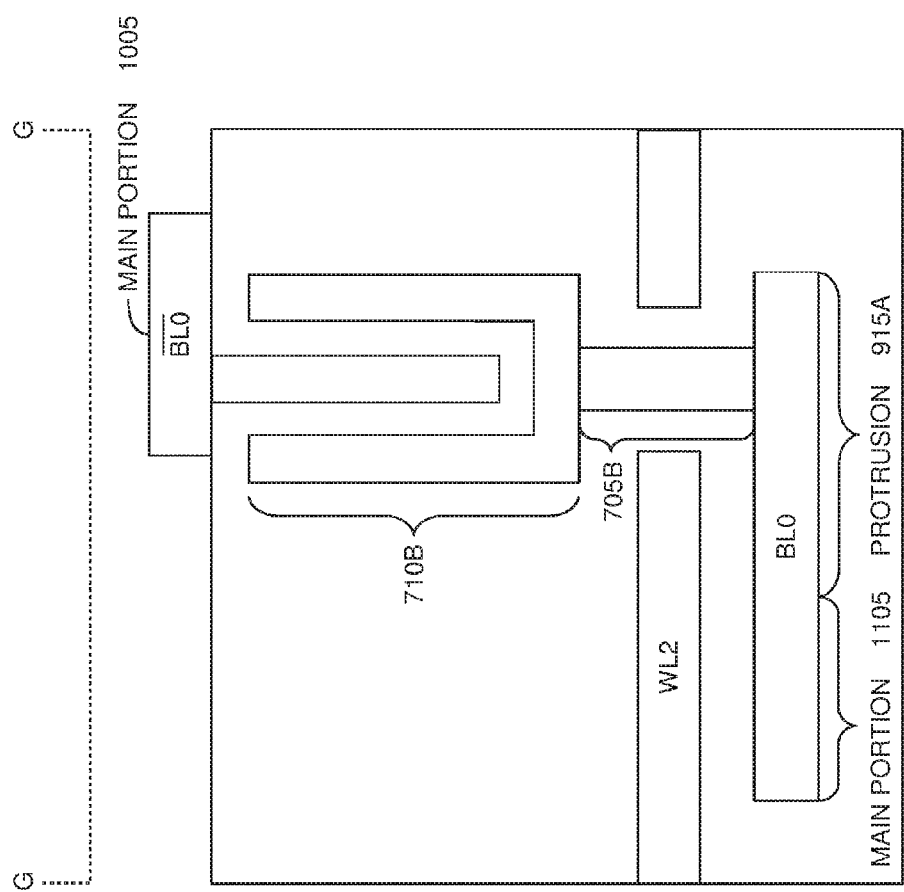

FIG. 11 is a cross section of the DRAM column in FIG. 7, according to one embodiment described herein. Specifically, FIG. 11 illustrates a view of the cross section G-G in FIG. 7. The bit line BL0 in FIG. 11 is divided into the protrusion 915A and a main portion 1105. As shown, the protrusion 915A extends away from the main portion 1105 perpendicular to the direction in which the main portion 1105 extends in the DRAM column 700 (i.e., into and out of the page).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements discussed above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A dynamic random access memory (DRAM), comprising:
   a first bit line and a second bit line, wherein the first and second bit lines form a complementary pair of bit lines coupled with a sense amplifier,
      wherein the first and second bit lines are disposed, at least partially, on a common plane;
   a storage capacitor having a first node coupled with the first bit line; and
   a transistor comprising a gate coupled with a word line, wherein the transistor comprises a second node coupled with a third node of the storage capacitor and a fourth node coupled with the second bit line,
   wherein the storage capacitor and the transistor are disposed in a vertical arrangement extending in a direction perpendicular to the common plane; and
   wherein the sense amplifier is configured to evaluate a voltage difference between the first and second bit lines to determine a data bit stored in the storage capacitor.

2. The DRAM of claim 1, wherein the first and second bit lines are the only bit lines coupled with the sense amplifier, and wherein there are no switches between the first and second bit lines and the sense amplifier.

3. The DRAM of claim 1, further comprising:
   a plurality of transistor and capacitor pairs coupled between the first and second bit lines, wherein, for each pair, at least one node of the transistor is coupled with one of the first and second bit lines and at least one node of the capacitors is coupled with one of the first and second bit lines.

4. The DRAM of claim 3, wherein the plurality of transistor and capacitor pairs form consecutive rows in the DRAM that are separately addressable using respective word lines.

5. The DRAM of claim 4, wherein a transistor in a first pair of the plurality of transistor and capacitor pairs is directly coupled with the first bit line and a capacitor in the first pair is directly coupled with the second bit line, and wherein a capacitor in a second pair of the plurality of transistor and capacitor pairs is directly coupled with the first bit line and a transistor in the second pair is directly coupled with the second bit line, wherein the first pair is in a first row in the DRAM directly adjacent to a second row containing the second pair in the DRAM.

6. The DRAM of claim 4, wherein a transistor in a first pair of the plurality of transistor and capacitor pairs is directly coupled with the first bit line and a capacitor in the first pair is directly coupled with the second bit line, and wherein a transistor in a second pair of the plurality of transistor and capacitor pairs is directly coupled with the first bit line and a capacitor in the second pair is directly coupled with the second bit line, wherein the first pair is in a first row in the DRAM directly adjacent to a second row containing the second pair in the DRAM.

7. The DRAM of claim 3, wherein each of the transistors and capacitors in the plurality of transistor and capacitor pairs are disposed in a vertical arrangement extending in a direction perpendicular to the common plane on which the first bit line is disposed, wherein the common plane is disposed on a substrate.

8. The DRAM of claim 7, further comprising:
   a jumper electrically connecting one of the first and second bit lines disposed on the common plane to a top portion of the vertical arrangement formed by one of the plurality of transistor and capacitor pairs.

9. The DRAM of claim 8, further comprising:
an extension electrically connecting a top portion of the vertical arrangement formed by one of the plurality of transistor and capacitor pairs with the juniper.

10. The DRAM of claim 9, wherein the extension is disposed on a second surface parallel to the first surface disposed on the substrate.

11. An integrated circuit, comprising:
a first bit line and a second bit line, wherein the first and second bit line form a complementary pair of bit lines coupled with a sense amplifier,
wherein the first bit line is disposed on a first surface disposed on a substrate and the second bit line is disposed on a second surface parallel to the first surface, wherein the second surface is different from the first surface;
a storage capacitor;
a transistor comprising a gate coupled with a word line, wherein the transistor and the storage capacitor are coupled in series between the first and second bit lines, and the storage capacitor and the transistor are disposed in a vertical arrangement extending in a direction perpendicular to the substrate and are between the first surface and the second surface, wherein the sense amplifier is configured to evaluate a voltage difference between the first and second bit lines to determine a data bit stored in the storage capacitor.

12. The integrated circuit of claim 11, wherein the first and second bit lines are the only bit lines coupled with the sense amplifier, and wherein there are no switches between the first and second bit lines and the sense amplifier.

13. The integrated circuit of claim 11, further comprising:
a plurality of transistor and capacitor pairs coupled between the first and second bit lines, wherein, for each pair, at least one node of the transistor is coupled with one of the first and second bit lines and at least one node of the capacitors is coupled with one of the first and second bit lines.

14. The integrated circuit of claim 13, wherein the plurality of transistor and capacitor pairs form consecutive rows that are separately addressable using respective word lines.

15. The integrated circuit of claim 14, wherein a transistor in a first pair of the plurality of transistor and capacitor pairs is directly coupled with the first bit line and a capacitor in the first pair is directly coupled with the second bit line, and wherein a capacitor in a second pair of the plurality of transistor and capacitor pairs is directly coupled with the first bit line and a transistor in the second pair is directly coupled with the second bit line, wherein the first pair is in a first row directly adjacent to a second row containing the second pair.

16. The integrated circuit of claim 14, wherein a transistor in a first pair of the plurality of transistor and capacitor pairs is directly coupled with the first bit line and a capacitor in the first pair is directly coupled with the second bit line, and wherein a transistor in a second pair of the plurality of transistor and capacitor pairs is directly coupled with the first bit line and a capacitor in the second pair is directly coupled with the second bit line, wherein the first pair is in a first row directly adjacent to a second row containing the second pair.

17. The integrated circuit of claim 13, wherein each of the transistors and capacitors in the plurality of transistor and capacitor pairs are disposed in a vertical arrangement extending in a direction perpendicular to the substrate on which the first bit line is disposed.

18. The integrated circuit of claim 16, wherein the first and second bit lines each comprise a main portion, and wherein the main portion of the first bit line is offset from the main portion of the second bit line.

19. The integrated circuit of claim 18, wherein the first bit line comprises a protrusion on the first surface that extends away from the main portion of the first bit line and is electrically connected to the main portion of the first bit line, and wherein the protrusion overlaps the main portion of the second bit line in a direction perpendicular to the first and second surfaces.

20. A method comprising:
activating a transistor, the transistor comprising a first node coupled with a storage capacitor in a DRAM, wherein a second node of the transistor is coupled with a first bit line and a third node of the storage capacitor is coupled with a second bit line, and wherein the first and second bit lines form a complementary pair of bit lines coupled with a sense amplifier,
wherein the first and second bit lines are disposed, at least partially, on a common plane, and
wherein the storage capacitor and the transistor are disposed in a vertical arrangement extending in a direction perpendicular to the common plane; and
evaluating, while the transistor is active, a voltage difference between the first and second bit lines using the sense amplifier to determine a data bit stored in the storage capacitor.

* * * * *